(12) United States Patent
Hsu et al.

(10) Patent No.: US 7,812,754 B2
(45) Date of Patent: Oct. 12, 2010

(54) DIGITAL TO ANALOG CONVERTER AND METHOD THEREOF

(75) Inventors: Jer-Hau Hsu, Hsinchu (TW); Tien-Yen Wang, Hsinchu (TW); Hsin-Yi Ho, Hsinchu (TW)

(73) Assignee: MACRONIX International Co, Ltd., Hsinchu (TW)

( * ) Notice: Subject to any disclaimer, the term of this patent is extended or adjusted under 35 U.S.C. 154(b) by 11 days.

(21) Appl. No.: 12/338,633

(22) Filed: Dec. 18, 2008

(65) Prior Publication Data

US 2010/0039304 A1 Feb. 18, 2010

Related U.S. Application Data

(60) Provisional application No. 61/089,610, filed on Aug. 18, 2008.

(51) Int. Cl.
*H03M 1/78* (2006.01)

(52) U.S. Cl. ...................................... 341/154; 341/144

(58) Field of Classification Search ................. 341/144, 341/145, 154
See application file for complete search history.

(56) References Cited

U.S. PATENT DOCUMENTS

| 3,755,807 | A | | 8/1973 | Brown | |
|---|---|---|---|---|---|
| 4,308,467 | A | * | 12/1981 | Kolluri et al. | 327/427 |
| 4,580,131 | A | | 4/1986 | Seiler | |
| 6,882,136 | B2 | * | 4/2005 | Nazarian et al. | 323/354 |
| 7,602,327 | B2 | * | 10/2009 | Din et al. | 341/154 |

* cited by examiner

*Primary Examiner*—Brian Young
(74) *Attorney, Agent, or Firm*—J.C. Patents

(57) ABSTRACT

A digital to analog converter (DAC) has a plurality of transistor-resistor units connected in a string. Each of the transistor-resistor units of the DAC has a pair of transistors that are turned on/off by a pair of complementary control signals. Since the two transistors of each transistor-resistor unit are positioned symmetrically, an equivalent resistance would be determined precisely according to received digital codes, such that an output voltage of the DAC could be adjusted precisely based on the equivalent resistance.

14 Claims, 4 Drawing Sheets

DIGITAL TO ANALOG CONVERTER AND METHOD THEREOF

CROSS-REFERENCE TO RELATED APPLICATION

This application claims the priority benefit of U.S. provisional application Ser. No. 61/089,610, filed Aug. 18, 2008. The entirety of the above-mentioned patent application is hereby incorporated by reference herein and made a part of this specification.

BACKGROUND OF THE INVENTION

1. Field of Invention

The present invention is related to a digital to analog converter and method thereof, and more particularly, to a digital to analog converter and method thereof for outputting an output voltage at a desired voltage level precisely.

2. Description of Related Art

The digital to analog converter (DAC) is widely used in current digital circuits. Most microcontrollers have a DAC to perform the digital to analog conversion operation. Please refer to FIG. 1, which is a circuit diagram of a DAC 10 according to the prior art. The DAC 10 has a negative feedback regulator 12, a ladder circuit 16, and a reference resistor $R_{REF}$. The negative feedback regulator 12 has an operational amplifier 14. The operational amplifier 14 has a positive input terminal coupled to a reference voltage $V_{REF}$, a negative input terminal coupled to an end of the ladder circuit 16, and an output terminal for outputting an output voltage $V_{OUT}$. The ladder circuit 16 has a plurality of transistor-resistor units $A_0$-$A_N$, where N is a positive integer. Each of the transistor-resistor units $A_0$-$A_N$ has a transistor and a resistor coupled to the transistor in series. For example, the transistor-resistor units $A_0$ has a transistor $M_0$ and a resistor $R_0$, and the transistor $M_0$ is coupled to the resistor $R_0$ in series. Additionally, except the resistor $R_0$ of the transistor-resistor unit $A_0$, the resistance of the resistor $R_1$-$R_N$ of each of the transistor-resistor units $A_1$-$A_N$ is $2^i$ times of that of the resistor $R_0$, where i is a positive integer. For example, $R_1 = 2^1 \times R_0$, $R_N = 2^N \times R_0$, etc. The gates of the transistors $M_0$-$M_N$ are biased by control voltages that are associated with digital codes $\overline{B_0}$ to $\overline{B_N}$. For each of the control voltages, the control voltage is high while the associated digital code is "1", and the control voltage is low while the associated digital code is "0". For example, when the digital code $\overline{B_0}$ is "1", the gate of the transistor $M_0$ is biased by a high-level control voltage, such that the transistor $M_0$ is turned on. When the digital code $\overline{B_0}$ is "0", the gate of the transistor $M_0$ is biased by a low-level control voltage, such that the transistor $M_0$ is turned off. Therefore, each of the digital codes $\overline{B_0}$ to $\overline{B_N}$ is used to turn on/off a corresponding one of the transistors $M_0$-$M_N$, and the output voltage $V_{OUT}$ could be determined as:

$$V_{OUT} = \left[ \frac{R_{ON} \times (\overline{B_0} + \overline{B_1} + \ldots + \overline{B_N}) +}{(R_0 B_0 + R_1 B_1 + \ldots + R_N B_N)} \right] \times \frac{V_{REF}}{R_{REF}} + V_{REF} \quad (1)$$

$$= \left[ \frac{R_{ON} \times (\overline{B_0} + \overline{B_1} + \ldots + \overline{B_N}) +}{\left( \begin{array}{c} 2^0 R_0 B_0 + \\ 2^1 R_0 B_1 + \ldots + 2^N R_0 B_N \end{array} \right)} \right] \times \frac{V_{REF}}{R_{REF}} + V_{REF} \quad (2)$$

where $R_{ON}$ represents the resistance of each turned-on transistor $M_0$-$M_N$, and each of $B_0$ to $B_N$ represents an digital code that is complementary to a corresponding one of the digital codes $\overline{B_0}$ to $\overline{B_N}$. For example, $B_0$ and $\overline{B_0}$ are complementary to each other; $B_1$ and $\overline{B_1}$ are complementary to each other; and $B_N$ and $\overline{B_N}$ are complementary to each other.

Each of combinations of the digital codes $\overline{B_0}$ to $\overline{B_N}$ is used to determine a corresponding voltage level of the output voltage $V_{OUT}$. In this case, it is assumed that a resistance $R_M$ is described as follows:

$$R_M = R_{ON} \times (\overline{B_0} + \overline{B_1} + \ldots + \overline{B_N}) \quad (3)$$

Therefore, the above equation (2) could be written as:

$$V_{OUT} = \left[ R_M + \left( \begin{array}{c} 2^0 R_0 B_0 + \\ 2^1 R_0 B_1 + \ldots + 2^N R_0 B_N \end{array} \right) \right] \times \frac{V_{REF}}{R_{REF}} + V_{REF} \quad (4)$$

$$= \left( \begin{array}{c} 2^0 R_0 B_0 + \\ 2^1 R_0 B_1 + \ldots + 2^N R_0 B_N \end{array} \right) \times \frac{V_{REF}}{R_{REF}} + \left( 1 + \frac{R_M}{R_{REF}} \right) V_{REF} \quad (5)$$

Generally, in order to output the output voltage $V_{OUT}$ at a desired level more precisely, it is desired that the value of $$\left( \left( 1 + \frac{R_M}{R_{REF}} \right) \times V_{REF} \right)$$

is a constant. However, according to the equation (3), the resistance $R_M$ varies with the digital codes $\overline{B_0}$ to $\overline{B_N}$, such that it is difficult to precisely output the output voltage $V_{OUT}$ at a desired level.

SUMMARY OF THE INVENTION

Accordingly, an object of the present invention is to provide a digital to analog converter for outputting a desired output voltage precisely. The digital to analog converter comprises an operational amplifier and a ladder circuit. The operational amplifier has an output terminal for outputting an output voltage. The ladder circuit is coupled to the output terminal and has a plurality of transistor-resistor units connected in a string. Each of the transistor-resistor units has a resistor, a first transistor coupled to the resistor in series, and a second transistor coupled to the resistor and the first transistor in parallel.

A further object of the present invention is to provide a digital to analog converting method for converting a plurality of digital codes into an output voltage. The method comprises inputting the plurality of digital codes; generating a pair of complementary control signals for each of the digital codes; applying the pairs of complementary control signals to a series of pairs of transistors to determine an equivalent resistance; and outputting the output voltage based on the equivalent resistance.

According to an exemplary embodiment of the present invention, the method further comprises providing a reference voltage and comparing the reference voltage with a terminal voltage of the series of pairs of transistors to refresh the output voltage.

According to an exemplary embodiment of the present invention, the first transistor is turned on while the second transistor is turned off, and the first transistor is turned off while the second transistor is turned on.

According to an exemplary embodiment of the present invention, a turned-on resistance of the first transistor is equal to a turned-on resistance of the second transistor.

According to an exemplary embodiment of the present invention, the operational amplifier further has a first input terminal coupled to a reference voltage and a second input terminal coupled to one end of the ladder circuit.

According to an exemplary embodiment of the present invention, the digital to analog converter further comprises a reference resistor coupled between the second input terminal and a ground terminal.

According to an exemplary embodiment of the present invention, the first transistor and the second transistor are n-channel metal-oxide-semiconductor field-effect transistors (NMOSFETs). Each of the NMOSFETs has a body and a source coupled to the body.

According to an exemplary embodiment of the present invention, the first transistor and the second transistor are p-channel metal-oxide-semiconductor field-effect transistors (PMOSFETs). Each of the PMOSFETs has a body and a source coupled to the body.

In order to make the aforementioned and other objects, features and advantages of the present invention comprehensible, several preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
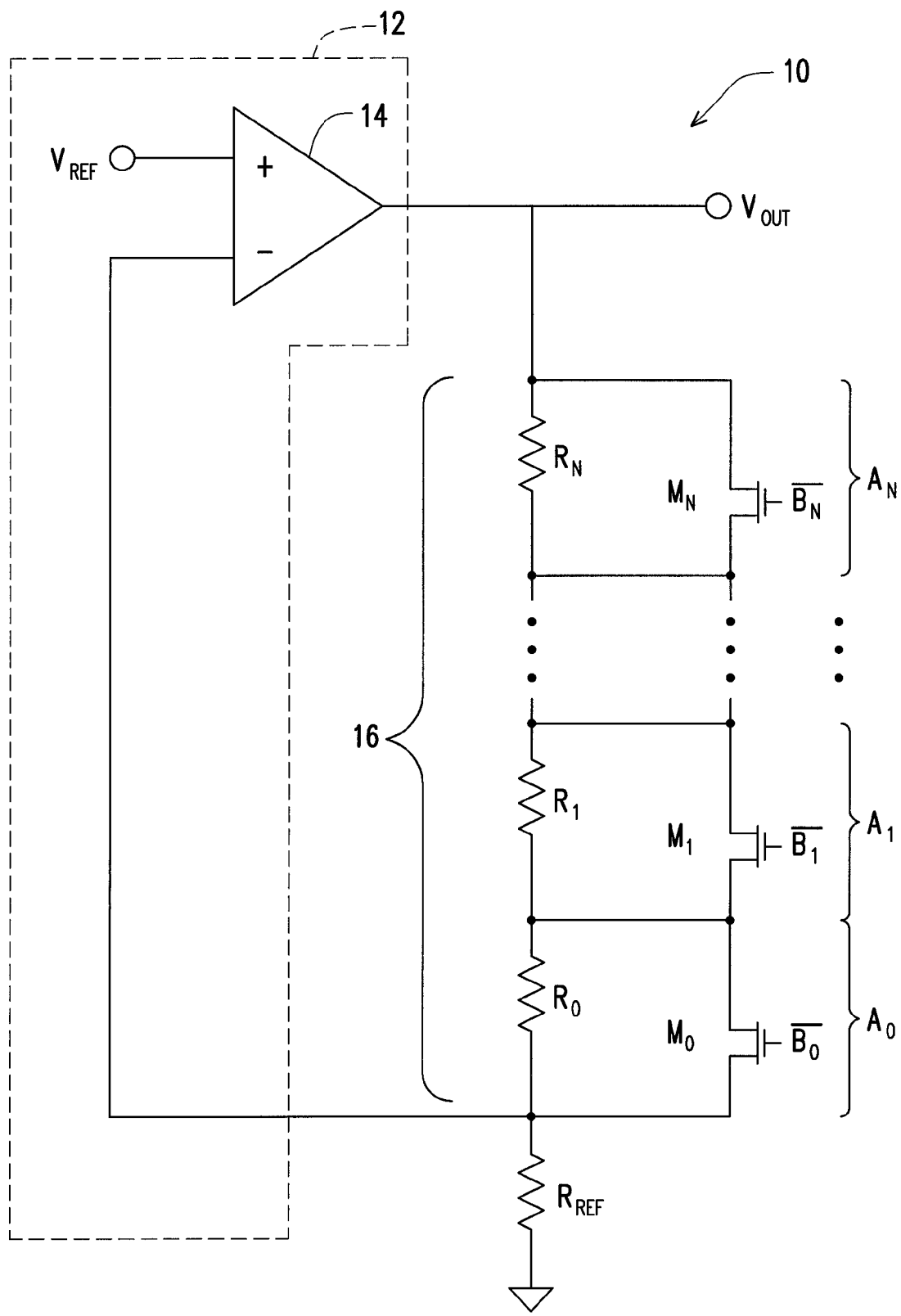
FIG. 1 is a circuit diagram of a DAC according to the prior art.
Figure 2:
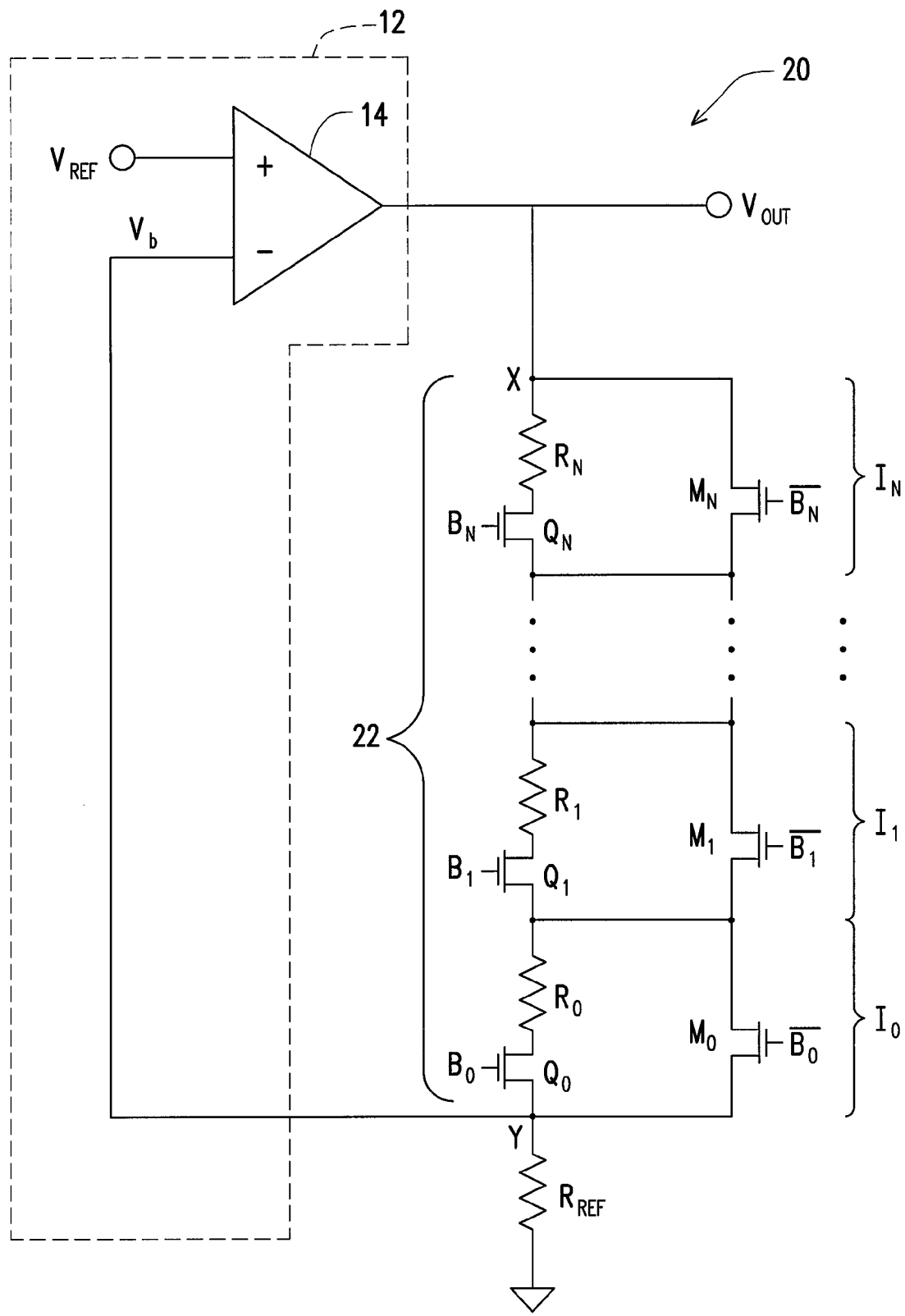
FIG. 2 is a circuit diagram of a DAC according to an embodiment of the present invention.

Please refer to FIG. 2, which is a circuit diagram of a DAC 20 according to an embodiment of the present invention. The DAC 20 has the negative feedback regulator 12, the reference resistor $R_{REF}$, and a ladder circuit 22. The positive input terminal of the operational amplifier 14 of the negative feedback regulator 12 is coupled to the reference voltage $V_{REF}$, the negative input terminal of the operational amplifier 14 is coupled to an end Y of the ladder circuit 16, and the output terminal of the operational amplifier 14 outputs the output voltage $V_{OUT}$. The reference resistor $R_{REF}$ is coupled between the negative input terminal of the operational amplifier 14 and a ground terminal. An end X of the ladder circuit 22 is coupled to the output terminal of the operational amplifier 14, and the other end Y of the ladder circuit 22 is coupled to the reference resistor $R_{REF}$ and the negative input terminal of the operational amplifier 14. A terminal voltage $V_b$ of the ladder circuit 22 at the end Y is inputted to the negative input terminal of the operational amplifier 14, such that the operational amplifier 14 would compare the reference voltage $V_{REF}$ with the terminal voltage $V_b$ to refresh the output voltage $V_{OUT}$. The ladder circuit 22 has a plurality of transistor-resistor units $I_0$-$I_N$ connected in a string, where N is a positive integer. Each of the transistor-resistor units $I_0$-$I_N$ has a resistor, a first transistor coupled to the resistor in series, and a second transistor coupled to the resistor and the first transistor in parallel. For example, the transistor-resistor units $I_0$ has resistor $R_0$, a first transistor $Q_0$ coupled to the resistor $R_0$ in series, and a second transistor $M_0$ coupled to the resistor $R_0$ and the first transistor $Q_0$ in parallel. Additionally, except the resistor $R_0$ of the transistor-resistor unit $I_0$, the resistance of the resistor $R_1$-$R_N$ of each of the transistor-resistor units $A_1$-$A_N$ is $2^i$ times of that of the resistor $R_0$, where i is a positive integer. For example, $R_1 = 2^1 \times R_0$, $R_N = 2^N \times R_0$, etc. The gates of the first transistors $Q_0$-$Q_N$ are biased by control voltages that are associated with digital codes $B_0$-$B_N$, and the gates of the second transistors $M_0$-$M_N$ are biased by control voltages that are associated with digital codes $\overline{B_0}$ to $\overline{B_N}$. Each of the digital codes $\overline{B_0}$ to $\overline{B_N}$ represents a digital code that is complementary to a corresponding one of the digital codes $B_0$ to $B_N$. For example, $B_0$ and $\overline{B_0}$ are complementary to each other; $B_1$ and $\overline{B_1}$ are complementary to each other; and $B_N$ and $\overline{B_N}$ are complementary to each other. For each of the control voltages, the control voltage is high while the associated digital code is "1", and the control voltage is low while the associated digital code is "0". For example, when the digital code $B_0$ is "1", the gate of the first transistor $Q_0$ is biased by a high-level control voltage, such that the first transistor $Q_0$ is turned on. Meanwhile, the digital code $\overline{B_0}$ is "0", and the gate the second transistor $M_0$ is biased by a low-level control voltage, such that the second transistor $M_0$ is turned off. On the other hand, when the digital code $B_0$ is "0", the gate of the first transistor $Q_0$ is biased by a low-level control voltage, such that the first transistor $Q_0$ is turned off. Meanwhile, the digital code $\overline{B_0}$ is "1", and the gate the second transistor $M_0$ is biased by a high-level control voltage, such that the second transistor $M_0$ is turned on. Briefly, for each of the digital codes $B_0$-$B_N$, a pair of complementary control signals are generated and applied to a pair of the first transistor and the second transistor of a corresponding one of the transistor-resistor units $A_1$-$A_N$, such that an equivalent resistance $R_{EQ}$ of the ladder circuit 22 could be determined as:

$$R_{EQ} = [(R_0 + R_{ON}) \times B_0 + (R_1 + R_{ON}) \times B_1 + \ldots + (R_N + R_{ON}) \times B_N] \quad (6)$$
$$+ R_{ON} \times (\overline{B_0} + \overline{B_1} + \ldots + \overline{B_N})$$

where $R_{ON}$ represents the resistance of each turned-on transistor among the first transistors $Q_0$-$Q_N$ and the second transistors $M_0$-$M_N$. In other words, each of the first transistors $Q_0$-$Q_N$ and the second transistors $M_0$-$M_N$ has the same turned-on resistance.

The output voltage $V_{OUT}$ could be determined based on the equivalent resistance $R_{EQ}$ as follows:

$$V_{OUT} = R_{EQ} \times \frac{V_{REF}}{R_{REF}} + V_{REF} \quad (7)$$

Additionally, the equation (7) could be rewritten according to the equation (6), such that the output voltage $V_{OUT}$ could be calculated as follow:

$$V_{OUT} = \begin{bmatrix} (R_0 + R_{ON}) \times B_0 + (R_1 + R_{ON}) \times \\ B_1 + \ldots + (R_N + R_{ON}) \times B_N + \\ R_{ON} \times (\overline{B_0} + \overline{B_1} + \ldots + \overline{B_N}) \end{bmatrix} \times \frac{V_{REF}}{R_{REF}} + V_{REF} \quad (8)$$

$$= \left\{ R_{ON} \times \begin{bmatrix} (\overline{B_0} + \overline{B_1} + \ldots + \overline{B_N}) + \\ (B_0 + B_1 + \ldots + B_N) \\ (R_0 B_0 + R_1 B_1 + \ldots + R_N B_N) \end{bmatrix} + \right\} \times \frac{V_{REF}}{R_{REF}} + V_{REF} \quad (9)$$

$$= \left\{ \begin{pmatrix} R_{ON} \times N + \\ 2^0 R_0 B_0 + \\ 2^1 R_0 B_1 + \ldots + 2^N R_0 B_N \end{pmatrix} \right\} \times \frac{V_{REF}}{R_{REF}} + V_{REF} \quad (10)$$

$$= \begin{pmatrix} 2^0 R_0 B_0 + \\ 2^1 R_0 B_1 + \ldots + 2^N R_0 B_N \end{pmatrix} \times \frac{V_{REF}}{R_{REF}} + \left(1 + \frac{R_{ON} \times N}{R_{REF}}\right) \times V_{REF} \quad (11)$$

In the equation (11), the term $$\left(\left(1 + \frac{R_{ON} \times N}{R_{REF}}\right) \times V_{REF}\right)$$

is a constant. Therefore, the voltage level of the output voltage $V_{OUT}$ could be precisely adjusted according to the digital codes $B_0$-$B_N$.

Figure 3:
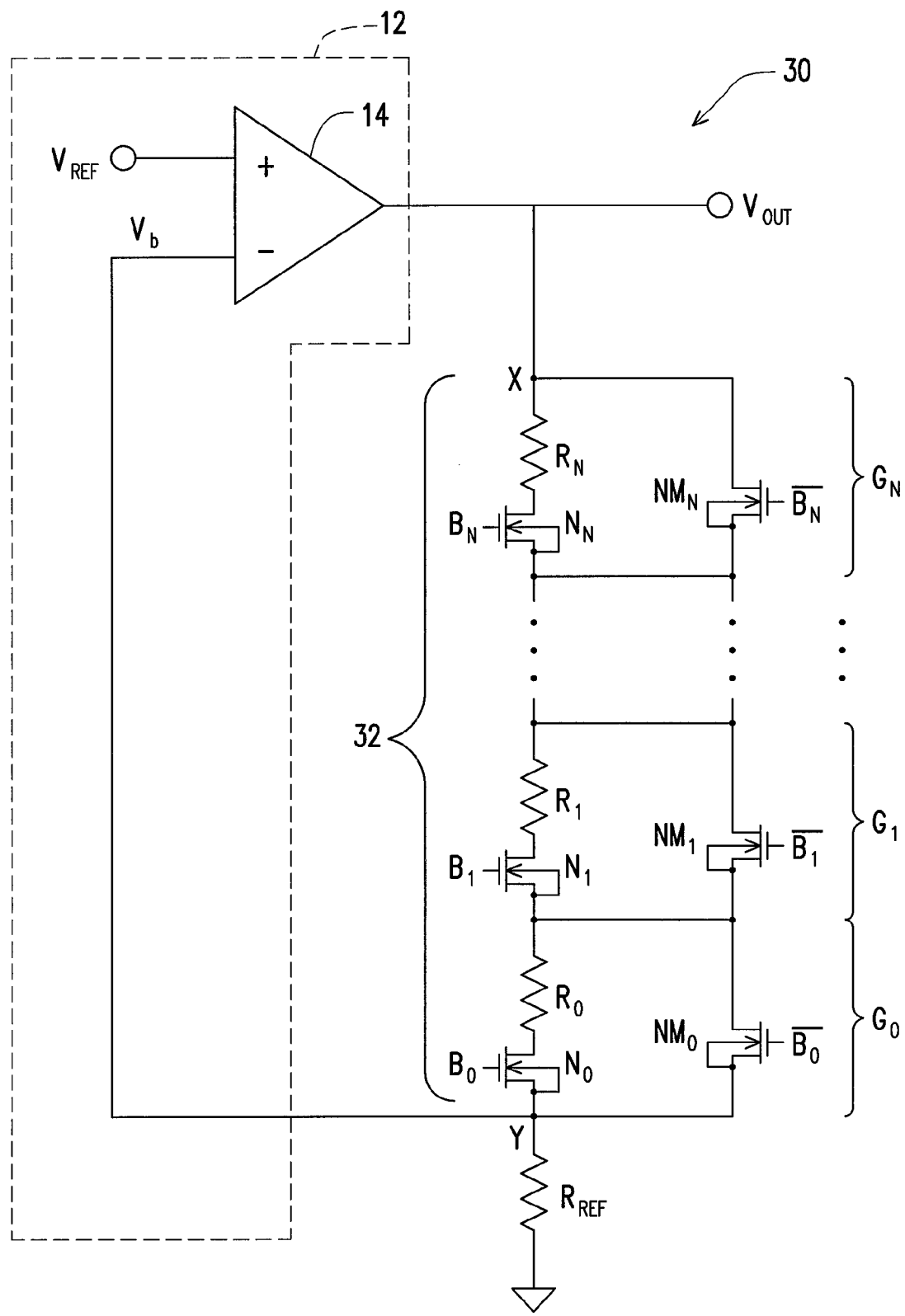
FIG. 3 is a circuit diagram of a DAC according to another embodiment of the present invention.

Please refer to FIG. 3, which is a circuit diagram of a DAC 30 according to another embodiment of the present invention. The DAC 30 is similar to the DAC 20 shown in FIG. 2. The major difference between the DAC 30 and the DAC 20 is that the first transistors $Q_0$-$Q_N$ and the second transistors $M_0$-$M_N$ of the DAC 20 are replaced with the n-channel metal-oxide-semiconductor field-effect transistors (NMOSFETs) $N_0$-$N_N$ and $NM_0$-$NM_N$. Each of the NMOSFETs $N_0$-$N_N$ and $NM_0$-$NM_N$ has a body and a source coupled to the body. The DAC 30 also has the negative feedback regulator 12, the reference resistor $R_{REF}$, and a ladder circuit 32. The ladder circuit 32 has a plurality of transistor-resistor units $G_0$-$G_N$ connected in a string. In the embodiment, the resistance of each turned-on transistor $R_{ON}$ could be calculated as follows:

$$R_{ON} = \mu \times C_{OX} \times \frac{W}{L}(V_{GS} - V_T) \quad (12)$$

where μ represents the mobility of the turned-on transistor;
$C_{OX}$ represents the gate oxide capacitance per unit area;
W represents the gate width of the turned-on transistor;
L represents the gate length of the turned-on transistor;
$V_{GS}$ represents the gate-source voltage of the turned-on transistor; and
$V_T$ represents the threshold voltage of the turned-on transistor.

The threshold voltage $V_T$ could be determined as follows:

$$V_T = V_{TO} + \gamma(\sqrt{V_{SB} + 2\phi} - \sqrt{2\phi}) \quad (13)$$

where $V_{SB}$ represents the source-body voltage of the turned-on transistor;
$V_{TO}$ represents the zero-$V_{SB}$ value of threshold voltage;
γ represents a body-effect parameter; and
2φ represents the surface potential parameter.

In the embodiment, because the source and the body of the turned-on transistor are coupled together, the source-body voltage $V_{SB}$ is 0 volt. Moreover, since the zero-$V_{SB}$ value $V_{TO}$, the body-effect parameter γ, and the surface potential parameter 2φ are constants, the transistors $N_0$-$N_N$ and $NM_0$-$NM_N$ have the same threshold voltage $V_T$. Therefore, if the transistors $N_0$-$N_N$ and $NM_0$-$NM_N$ have an identical ratio W/L, the transistors $N_0$-$N_N$ and $NM_0$-$NM_N$ would have an identical turned-on transistor $R_{ON}$. Generally, the output voltage $V_{OUT}$ of the DAC 30 could be calculated according the equations (8)-(11).

Figure 4:
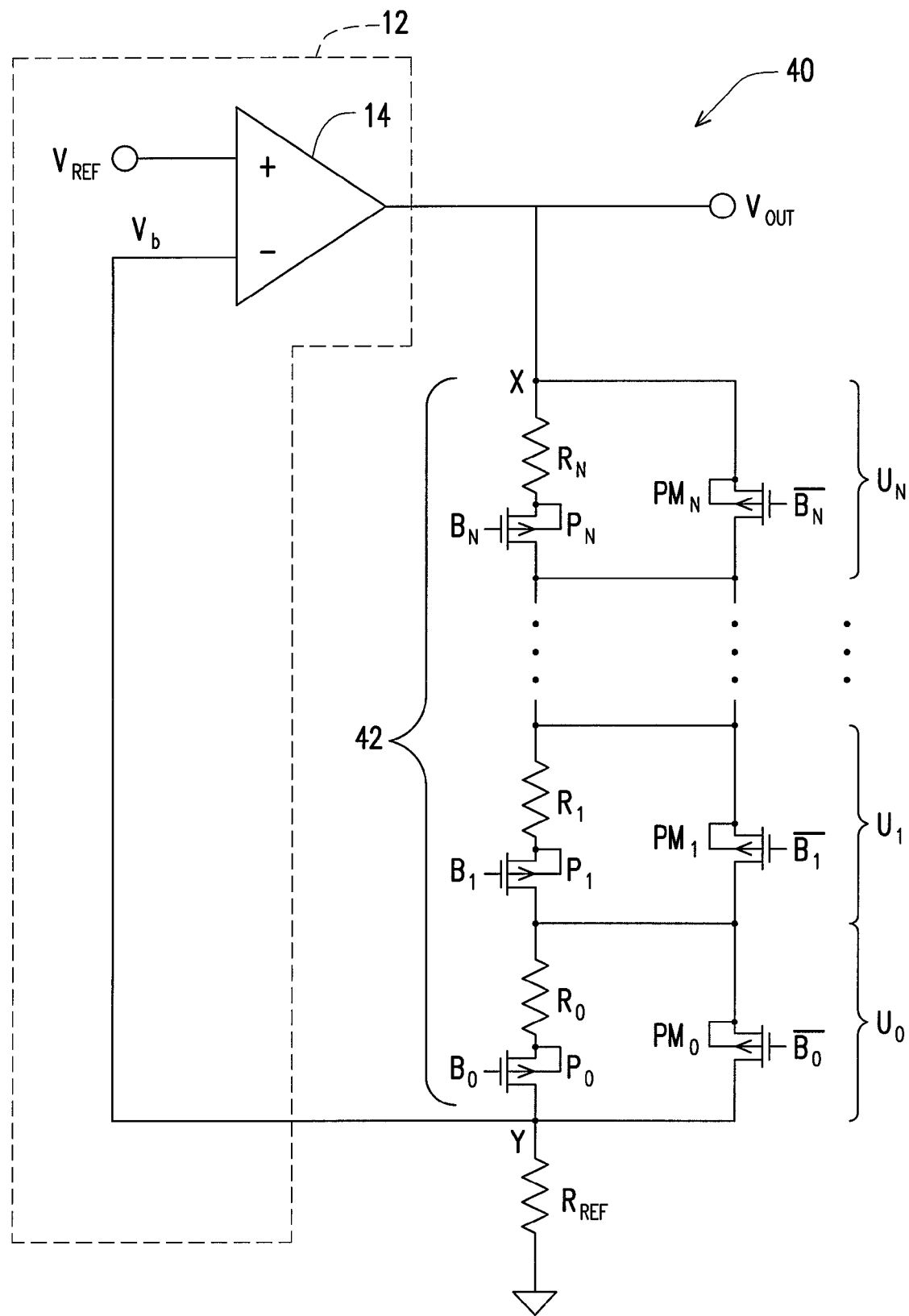
FIG. 4 is a circuit diagram of a DAC according to another embodiment of the present invention.

Please refer to FIG. 4, which is a circuit diagram of a DAC 40 according to another embodiment of the present invention. The DAC 40 is similar to the DAC 30 shown in FIG. 3. The major difference between the DAC 40 and the DAC 30 is that the NMOSFETs $N_0$-$N_N$ and $NM_0$-$NM_N$ are replaced with the p-channel metal-oxide-semiconductor field-effect transistors (PMOSFETs) $P_0$-$P_N$ and $PM_0$-$PM_N$. Each of the PMOSFETs $P_0$-$P_N$ and $PM_0$-$PM_N$ has a body and a source coupled to the body. The DAC 40 also has the negative feedback regulator 12, the reference resistor $R_{REF}$, and a ladder circuit 42. The ladder circuit 42 has a plurality of transistor-resistor units $U_0$-$U_N$ connected in a string. In the embodiment, the resistance of each turned-on transistor $R_{ON}$ could be calculated as follows:

$$R_{ON} = \mu \times C_{OX} \times \frac{W}{L}(V_{SG} - V_T) \quad (14)$$

where $V_{SG}$ represents the source-gate voltage of the turned-on transistor.

The threshold voltage $V_T$ could be determined as follows:

$$V_T = V_{TO} + \gamma(\sqrt{V_{BS} + 2\phi} - \sqrt{2\phi}) \quad (15)$$

where $V_{BS}$ represents the body-source voltage of the turned-on transistor;
$V_{TO}$ represents the zero-$V_{BS}$ value of threshold voltage.

In the embodiment, because the source and the body of the turned-on transistor are coupled together, the body-source voltage $V_{BS}$ is 0 volt. Moreover, since the zero-$V_{BS}$ value $V_{TO}$, the body-effect parameter γ, and the surface potential parameter 2φ are constants, the transistors $P_0$-$P_N$ and $PM_0$-$PM_N$ have the same threshold voltage $V_T$. Therefore, if the transistors $P_0$-$P_N$ and $PM_0$-$PM_N$ have an identical ratio W/L, the transistors $P_0$-$P_N$ and $PM_0$-$PM_N$ would have an identical turned-on transistor $R_{ON}$. Generally, the output voltage $V_{OUT}$ of the DAC 40 could be calculated according the equations (8)-(11).

In view of the above, according to the present invention, each of the transistor-resistor units of the DAC has a pair of transistors that are turned on/off by a pair of complementary control signals. Since the two transistors of each transistor-resistor unit are positioned symmetrically, an equivalent resistance would be determined precisely according to received digital codes. Therefore, an output voltage of the DAC could be adjusted precisely based on the equivalent resistance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital to analog converter, comprising:
an operational amplifier having an output terminal for outputting an output voltage; and
a ladder circuit coupled to the output terminal, the ladder circuit having a plurality of transistor-resistor units connected in a string, each of the transistor-resistor units having a resistor, a first transistor coupled to the resistor in series, and a second transistor coupled to the resistor and the first transistor in parallel;
wherein the first transistor is turned on while the second transistor is turned off, and the first transistor is turned off while the second transistor is turned on.

2. The digital to analog converter as claimed in claim 1, wherein a pair of complementary control signals is applied to the first transistor and the second transistor to turn on/off the first transistor and the second transistor.

3. The digital to analog converter as claimed in claim 1, wherein a turned-on resistance of the first transistor is equal to a turned-on resistance of the second transistor.

4. The digital to analog converter as claimed in claim 1, wherein the operational amplifier further has a first input terminal coupled to a reference voltage and a second input terminal coupled to one end of the ladder circuit.

5. The digital to analog converter as claimed in claim 4 further comprising a reference resistor coupled between the second input terminal and a ground terminal.

6. The digital to analog converter as claimed in claim 1, wherein the first transistor and the second transistor are n-channel metal-oxide-semiconductor field-effect transistors (NMOSFETs), each of the NMOSFETs has a body and a source coupled to the body.

7. The digital to analog converter as claimed in claim 1, wherein the first transistor and the second transistor are p-channel metal-oxide-semiconductor field-effect transistors (PMOSFETs), each of the PMOSFETs has a body and a source coupled to the body.

8. A digital to analog converting method for converting a plurality of digital codes into an output voltage, the method comprising:
inputting the plurality of digital codes;
generating a pair of complementary control signals for each of the digital codes;
applying the pairs of complementary control signals to a series of pairs of transistors to determine an equivalent resistance; and
outputting the output voltage based on the equivalent resistance;
wherein each of the pairs of transistors has a first transistor and a second transistor, the first transistor and the second transistor are connected in parallel, the first transistor is turned on while the second transistor is turned off, and the first transistor is turned off while the second transistor is turned on.

9. The method as claimed in claim 8 further comprising:
providing a reference voltage; and
comparing the reference voltage with a terminal voltage of the series of pairs of transistors to refresh the output voltage.

10. The method as claimed in claim 8, wherein each of the pairs of transistors further has a resistor, the resistor and the first transistor are connected in series.

11. The method as claimed in claim 8, wherein a turned-on resistance of the first transistor is equal to a turned-on resistance of the second transistor.

12. The method as claimed in claim 8, wherein the first transistor and the second transistor are n-channel metal-oxide-semiconductor field-effect transistors (NMOSFETs), each of the NMOSFETs has a body and a source coupled to the body.

13. The method as claimed in claim 8, wherein the first transistor and the second transistor are p-channel metal-oxide-semiconductor field-effect transistors (PMOSFETs), each of the PMOSFETs has a body and a source coupled to the body.

14. A digital to analog converter, comprising:
an operational amplifier having an output terminal for outputting an output voltage and a negative input terminal; and
a ladder circuit coupled between the negative input terminal and the output terminal, the ladder circuit having a plurality of transistor-resistor units connected in a string, each of the transistor-resistor units having a resistor, a first transistor coupled to the resistor in series, and a second transistor coupled to the resistor and the first transistor in parallel.

* * * * *